United States Patent
Dupont et al.

(10) Patent No.: US 12,027,505 B2
(45) Date of Patent: Jul. 2, 2024

(54) OPTOELECTRONIC DEVICE COMPRISING LIGHT-EMITTING DIODES WITH IMPROVED LIGHT EXTRACTION

(71) Applicant: Aledia, Echirolles (FR)

(72) Inventors: Tiphaine Dupont, Grenoble (FR); Ivan-Christophe Robin, Grenoble (FR)

(73) Assignee: Aledia, Echirolles (FR)

( * ) Notice: Subject to any disclaimer, the term of this patent is extended or adjusted under 35 U.S.C. 154(b) by 517 days.

(21) Appl. No.: 17/287,087

(22) PCT Filed: Oct. 18, 2019

(86) PCT No.: PCT/EP2019/078320
§ 371 (c)(1),
(2) Date: Apr. 20, 2021

(87) PCT Pub. No.: WO2020/083757
PCT Pub. Date: Apr. 30, 2020

(65) Prior Publication Data
US 2021/0384175 A1    Dec. 9, 2021

(30) Foreign Application Priority Data
Oct. 22, 2018 (FR) ..................... 1871254

(51) Int. Cl.
*H01L 25/13* (2006.01)
*H01L 33/20* (2010.01)
(Continued)

(52) U.S. Cl.
CPC ............. *H01L 25/13* (2013.01); *H01L 33/20* (2013.01); *H01L 33/32* (2013.01); *H01L 33/54* (2013.01);
(Continued)

(58) Field of Classification Search
CPC ......... H01L 33/20; H01L 33/32; H01L 33/54; H01L 33/58; H01L 33/62; H01L 2933/005; H01L 33/38; H01L 33/08; H01L 33/18
See application file for complete search history.

(56) References Cited

U.S. PATENT DOCUMENTS

| | | | |
|---|---|---|---|
| 2005/0280016 A1* | 12/2005 | Mok | ....................... H01L 24/97 257/E33.059 |
| 2007/0023765 A1 | 2/2007 | Thomas et al. | |

(Continued)

FOREIGN PATENT DOCUMENTS

TW    201624761 A    7/2016

OTHER PUBLICATIONS

International Preliminary Report on Patentability for International Application No. PCT/EP2019/078320, dated May 6, 2021.
(Continued)

*Primary Examiner* — Syed I Gheyas
(74) *Attorney, Agent, or Firm* — Wolf, Greenfield & Sacks, P.C.

(57) ABSTRACT

An optoelectronic device including a support including a face; light-emitting diodes lying on the face and comprising including semiconductor elements in the form of wires, cones or truncated cones; for each light-emitting diode, an encapsulation block at least partially transparent to the radiation emitted by the light-emitting diodes and covering the light-emitting diode, the maximum thickness of the encapsulation block being comprised between 1 μm and 30 μm, interstices of air being present between the encapsulation blocks covering adjacent diodes; and an electrically conductive layer covering the encapsulation blocks, wherein
(Continued)

the refractive index of the encapsulation block covering at least one of the light-emitting diodes is comprised between 1.3 and 1.6.

16 Claims, 9 Drawing Sheets

(51) Int. Cl.
- *H01L 33/32* (2010.01)
- *H01L 33/54* (2010.01)
- *H01L 33/58* (2010.01)
- *H01L 33/62* (2010.01)

(52) U.S. Cl.
CPC .............. *H01L 33/58* (2013.01); *H01L 33/62* (2013.01); *H01L 2933/005* (2013.01)

(56) References Cited

U.S. PATENT DOCUMENTS

| | | | |
|---|---|---|---|
| 2010/0084678 A1 | 4/2010 | Streubel et al. | |
| 2012/0181568 A1* | 7/2012 | Hsia | H01L 33/0095 257/E33.056 |
| 2015/0144873 A1 | 5/2015 | Hwang et al. | |
| 2016/0020358 A1* | 1/2016 | Lee | H01L 33/08 257/13 |
| 2016/0111593 A1 | 4/2016 | Dechoux et al. | |

OTHER PUBLICATIONS

International Search Report and Written Opinion for International Application No. PCT/EP2019/078320, dated Nov. 26, 2019.
Office Action for Taiwanese Application No. 108137858 dated May 29, 2023.

* cited by examiner

OPTOELECTRONIC DEVICE COMPRISING LIGHT-EMITTING DIODES WITH IMPROVED LIGHT EXTRACTION

This Application is a national stage filing under 35 U.S.C. § 371 of International Patent Application Serial No. PCT/EP2019/078320, filed Oct. 18, 2019, which claims priority to French patent application FR18/71254, filed Oct. 22, 2018. The entire contents of these applications are incorporated herein by reference in their entireties.

TECHNICAL FIELD

The present disclosure relates generally to optoelectronic devices based on semiconductor materials and methods for their manufacture. The present invention relates more specifically to optoelectronic devices comprising light-emitting diodes formed by three-dimensional elements, in particular semiconductor microwires or nanowires.

BACKGROUND ART

By optoelectronic devices comprising light-emitting diodes, devices are understood that are adapted to effect the conversion of an electric signal into electromagnetic radiation, and in particular devices dedicated to the emission of electromagnetic radiation, in particular light. Examples of three-dimensional elements adapted to the realisation of light-emitting diodes are microwires or nanowires comprising a semiconductor material based on a compound predominantly comprising at least one element from group III and one element from group V (for example gallium nitride GaN), called III-V compound in the following.

The light extraction efficiency (LEE) of an optoelectronic device is generally defined by the ratio between the number of photons that escape from the optoelectronic device and the number of photons emitted by the light-emitting diodes. It is desirable that the extraction efficiency of an optoelectronic device is as high as possible.

A drawback of the existing optoelectronic devices is that a fraction of the photons emitted within each light-emitting diode does not escape from the light-emitting diode.

SUMMARY OF INVENTION

Thus, one object of an embodiment is to at least partially address the drawbacks of the optoelectronic devices comprising light-emitting diodes, in particular comprising microwires or nanowires, described in the foregoing and methods for their manufacture.

A further object of an embodiment is to increase the extraction efficiency of the optoelectronic device.

A further object of an embodiment is to reduce the proportion of the light that does not escape from each light-emitting diode.

A further object of an embodiment is to reduce the proportion of the light emitted by a light-emitting diode that is absorbed/trapped by the adjacent light-emitting diodes.

One embodiment provides an optoelectronic device comprising:
  a support comprising a face;
  light-emitting diodes lying on the face and comprising semiconductor elements in the form of wires, cones or truncated cones;
  for each light-emitting diode or for each group of light-emitting diodes, an encapsulation block at least partially transparent to the radiation emitted by the light-emitting diodes and covering the light-emitting diode or the group of light-emitting diodes, the maximum thickness of the encapsulation block being comprised between 1 µm and 30 µm, interstices of air being present between the encapsulation blocks covering adjacent light-emitting diodes or adjacent groups of light-emitting diodes; and
  an electrically conductive layer covering the encapsulation blocks and in contact with each light-emitting diode,
  wherein the refractive index of the encapsulation block covering at least one of the light-emitting diodes or one of the groups of light-emitting diodes is comprised between 1.3 and 1.6.

A further embodiment provides an optoelectronic device comprising:
  a support comprising a face;
  light-emitting diodes lying on the face and comprising semiconductor elements in the form of wires, cones or truncated cones;
  for each light-emitting diode or each group of light-emitting diodes, an encapsulation block at least partially transparent to the radiation emitted by the light-emitting diodes and covering the light-emitting diode or the group of light-emitting diodes, the maximum thickness of the encapsulation block being comprised between 1 µm and 30 µm, interstices of air being present between the encapsulation blocks covering adjacent diodes or adjacent groups of light-emitting diodes; and
  an electrically conductive layer covering the encapsulation blocks and in contact with each light-emitting diode,
  wherein the optoelectronic device comprises, for at least one of the encapsulation blocks, a conformal dielectric layer covering the encapsulation block, at least partially transparent to the radiation emitted by the light-emitting diodes, the refractive index of the encapsulation block being comprised between 1.8 and 2.2, the thickness of the dielectric layer being comprised between 200 nm and 5 µm, and the refractive index of the dielectric layer being comprised between 1.3 and 1.6.

According to an embodiment, the dielectric layer is placed between the electrically conductive layer and the encapsulation block or the electrically conductive layer is placed between the dielectric layer and the encapsulation block.

According to an embodiment, each semiconductor element is a III-V compound.

According to an embodiment, each semiconductor element comprises gallium nitride.

According to an embodiment, the average diameter of each semiconductor element is comprised between 200 nm and 2 µm and the average diameter of each encapsulation block is comprised between 3 µm and 30 µm.

According to an embodiment, the device comprises, moreover, for at least one light-emitting diode, a photoluminescent layer covering the encapsulation block.

According to an embodiment, the device comprises lenses covering the encapsulation blocks, the interstices of air being present between the lenses.

According to an embodiment, the device comprises, moreover, an angular filter covering the lenses.

According to an embodiment, the angular filter comprises a layer at least partially opaque to the visible light and spanned by openings.

A further embodiment provides a method for manufacturing an optoelectronic device comprising a support comprising a face and light-emitting diodes lying on the face and comprising semiconductor elements in the form of wires, cones or truncated cones. The method comprises the formation, for each light-emitting diode or each group of light-emitting diodes, of an encapsulation block at least partially transparent to the radiation emitted by the light-emitting diodes and covering the light-emitting diode or the group of light-emitting diodes, the maximum thickness of the encapsulation block being comprised between 1 µm and 30 µm, interstices of air being present between the encapsulation blocks covering adjacent light-emitting diodes or adjacent groups of light-emitting diodes, and the formation of an electrically conductive layer covering the encapsulation blocks and in contact with each light-emitting diode, wherein the refractive index of the encapsulation block covering at least one of the light-emitting diodes or one of the groups of light-emitting diodes is comprised between 1.3 and 1.6.

A further embodiment provides a method for manufacturing an optoelectronic device comprising a support comprising a face and light-emitting diodes lying on the face and comprising semiconductor elements in the form of wires, cones or truncated cones, the method comprising the formation, for each light-emitting diode or each group of light-emitting diodes, of an encapsulation block at least partially transparent to the radiation emitted by the light-emitting diodes and covering the light-emitting diode or the group of light-emitting diodes, the maximum thickness of the encapsulation block being comprised between 1 µm and 30 µm, interstices of air being present between the encapsulation blocks covering adjacent light-emitting diodes or adjacent groups of light-emitting diodes, and the formation of an electrically conductive layer covering the encapsulation blocks and in contact with each light-emitting diode. The optoelectronic device comprises, for at least one of the encapsulation blocks, a conformal dielectric layer covering the encapsulation block, and at least partially transparent to the radiation emitted by the light-emitting diodes, the refractive index of the encapsulation block being comprised between 1.8 and 2.2, the thickness of the dielectric layer being comprised between 200 nm and 5 µm, and the refractive index of the dielectric layer being comprised between 1.3 and 1.6.

According to an embodiment, the method comprises the formation of lenses covering the encapsulation blocks.

According to an embodiment, the method comprises the formation of a monobloc structure comprising the lenses, each lens comprising a slot and comprising the fixation of the monobloc structure to the support, the encapsulation blocks being inserted into the slots.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may have identical structural, dimensional and material properties. For the sake of clarity, only the operations and elements that are useful for an understanding of the described embodiments herein have been illustrated and described in detail. In particular, the means of biasing the light-emitting diodes of an optoelectronic device are well known and have not been described.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures or to an optoelectronic device in a normal position of usage. Moreover, "component mainly constituted by a material" or "compound based on a material" are understood to mean that a compound comprises a proportion that is greater than or equal to 95% of said material, this proportion preferably being greater than 99%. Unless otherwise specified, the expressions "around", "approximately", "substantially" and "in the order of" signify within 10%, and preferably within 5%. In the following disclosure, "conductive layer" is understood to mean an electrically conductive layer and "isolating layer" is understood to mean an electrically isolating layer.

The present disclosure relates to optoelectronic devices comprising three-dimensional elements, for example elements in the form of wires, cones or truncated cones, in particular microwires or nanowires.

The term "microwire" or "nanowire" designates a three-dimensional structure with an elongated form in a privileged direction at least two dimensions of which, called minor dimensions, are comprised between 5 nm and 2.5 µm, preferably between 50 nm and 2.5 µm, the third dimension, called the major dimension, being at least equal to once, preferably at least 5 times and even more preferably at least 10 times, greater than the minor dimensions. In certain embodiments, the minor dimensions can be less than or equal to approximately 1.5 µm, preferably comprised between 100 nm and 1.5 µm, more preferably between 100 nm and 800 nm. In certain embodiments, the height of each microwire or nanowire can be greater than or equal to 500 nm, preferably comprised between 1 µm and 50 µm.

In the following disclosure, the term "wire" is used to signify "microwire or nanowire". Preferably, the mean line of the wire that transects the barycentres of the cross sections, in planes perpendicular to the privileged direction of the wire, is substantially rectilinear and is called "axis" of the wire in the following.

Figure 1:
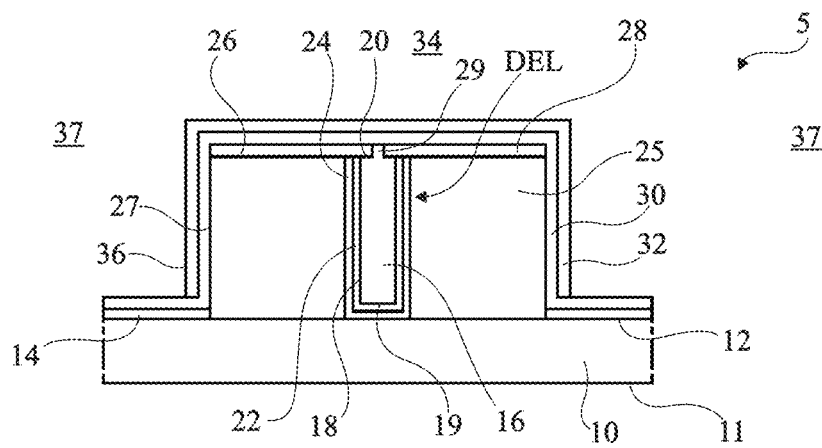
FIG. 1 illustrates an embodiment of an optoelectronic device comprising microwires or nanowires.

FIG. 1 is a partial and schematic sectional view of an embodiment of an optoelectronic device 5 comprising light-emitting diodes, a sole light-emitting diode being illustrated.

FIG. 1 illustrates a structure comprising, from the bottom upwards:
- a conductive support 10 comprising a lower face 11 and an upper face 12, the upper face 12 preferably being flat at least at the light-emitting diodes;
- light-emitting diodes DEL, a sole light-emitting diode being illustrated in a schematic fashion in FIG. 1, each light-emitting diode DEL comprising a wire 16, comprising a lateral wall 18, a lower end wall 19 and an upper end wall 20, each light-emitting diode DEL further comprising a casing 22, comprising a stack of semiconductor layers, at least partly covering the lateral wall 18 and completely covering the lower end wall 19;
- for each light-emitting diode DEL, a conductive layer 24 forming a first electrode, covering the casing 22 and in contact with the casing 22, the conductive layer 24 further being placed between the portion of the casing 22 covering the lower end wall 19 of the wire 16 and the support 10 and being in contact with the support 10;
- for each light-emitting diode DEL, an isolating encapsulation block 25 lying on the support 10, completely surrounding the light-emitting diode DEL and being in contact with the first electrode 24 along the entire lateral wall of the light-emitting diode DEL, the encapsulation block 25 comprising an upper face 26 and a lateral wall 27;
- an isolating layer 14 extending over the face 12 of the support 10 around the encapsulation blocks 25;
- for each light-emitting diode DEL, an isolating layer 28 extending over the upper face 26 of the encapsulation block 25 and over a part of the upper end wall 20 of the wire 16, the wire 16 comprising a protuberance 29 at the upper wall 20 extending through the isolating layer 28;
- a conductive layer 30, forming a second electrode, extending, for each light-emitting diode, over the lateral wall 27 of the associated encapsulation block 25, over the associated isolating layer 28, and over the isolating layer 14 between the encapsulation blocks 25 and in contact with the protuberances 29 of each light-emitting diode DEL; and
- an isolating layer 32 covering the conductive layer 30, and covering in particular the entirety of the upper face 26 of the encapsulation block 25 and the entirety of the lateral wall 27 of the encapsulation block 25.

According to a further embodiment, the isolating layer 32 is not present. According to a further embodiment, the isolating layer 32 is placed between the conductive layer 30 and the encapsulation block 25.

In the present embodiment, the light-emitting diodes DEL are connected in parallel and form a set of light-emitting diodes. As a variant, the electrodes 24 and 30 can be arranged in order to connect the light-emitting diodes in different manners.

According to an embodiment, the isolating layer 32 is in contact with air 34. The front face 36 of the optoelectronic device 5 is the face seen by an observer and comprises in particular the faces exposed to the air 34 of the encapsulation blocks 25 when the layer 32 is not present, or the faces exposed to the air 34 of the layer 32 when the layer 32 is present. In particular, an interstice of air 37 is placed between each pair of adjacent light-emitting diodes.

According to an embodiment, the material composing the encapsulation block 25 has an optical refractive index, also called refractive index, for the wavelengths of the radiation emitted by the light-emitting diodes DEL, strictly lower than the refractive index of the material composing the wire 16 and strictly greater than the refractive index of the material composing the isolating layer 32. The optical refractive index is a dimensionless number that characterises the optical properties of a medium, in particular absorption and diffusion. The refractive index is equal to the real part of the complex optical index. The refractive index can be determined, for example, by ellipsometry. Unless otherwise indicated, when the following disclosure refers to a refractive index, this is a refractive index for the wavelengths of the radiation emitted by the light-emitting diodes DEL. According to an embodiment, the material composing the isolating layer 32 has an optical refractive index strictly lower than the refractive index of the material composing the encapsulation block 25 and strictly greater than the refractive index of air.

The support 10 can correspond to a monobloc structure or comprise a base covered by a conductive layer. The upper face 12 is electrically conductive and is for example metal, for example made of aluminium, of silver, of copper or of zinc. The support 10 can comprise various conductive areas electrically isolated from one another. By this means, it is possible to address the various light-emitting diodes independently. According to an embodiment, the face 12 can be reflective. The support 10 can thus have a specular reflection. According to a further embodiment, the support 10 can thus have a Lambertian reflection. In order to obtain a surface having a Lambertian reflection, one possibility is to create irregularities on a conductive surface. For instance, when the face 12 corresponds to the face of a conductive layer lying on a base, a texturing of the surface of the base can be realised before the deposition of the metal layer so that the face 12 of the metal layer, once deposited, exhibits reliefs.

The wires 16 are, at least partly, formed from at least one semiconductor material. The wires 16 can be, at least partly, formed from semiconductor materials predominantly comprising a III-V compound, for example a III-N compound. Examples of elements from group III comprise gallium (Ga), indium (In) or aluminium (Al). Examples of III-N compounds are GaN, AlN, InN, InGaN, AlGaN or AlInGaN. Further elements from group V can also be used, for example, phosphorus or arsenic. Generally speaking, the elements in the III-V compound can be combined with various mole fractions. The wires 16 can comprise a dopant. For instance, for III-V compounds, the dopant can be chosen from the group comprising a p-type dopant from group II, for example magnesium (Mg), zinc (Zn), cadmium (Cd) or mercury (Hg), a p-type dopant from group IV, for example carbon (C) or an n-type dopant from group IV, for example silicon (Si), germanium (Ge), selenium (Se), sulphur (S), terbium (Tb) or tin (Sn).

The cross section of the wires 16 can have various shapes, such as, for example, an oval, circular or polygonal shape, in particular triangular, rectangular, square or hexagonal. Thus, it is understood that, when the "diameter" in a cross section of a wire or a layer deposited on this wire is mentioned here, this is a variable associated with the surface area of the desired structure in this cross section, corresponding, for example, to the diameter of the disk having the same surface area as the cross section of the wire. The height of each wire 16 can be comprised between 250 nm and 50 µm. Each wire 16 can have a semiconductor structure elongated along an axis substantially perpendicular to the face 12. Each wire 16 can have a general cylindrical shape. The axes of two adjacent wires 16 can be distant by 0.5 µm to 10 µm and preferably by 1.5 µm to 6 µm. For instance, the wires 16 can be distributed regularly, in particular in accordance with a hexagonal or square array.

The casing 22 can comprise a stack of a plurality of layers comprising in particular:
an active layer covering at least partly the lateral wall 18 and the entirety of the lower wall 19 of the associated wire 16;
an intermediate layer of a type of conductivity opposite that of the wire 16 covering the active layer; and
a coupling layer covering the intermediate layer and covered by the electrode 24.

The active layer is the layer from which the majority of the radiation provided by the light-emitting diode DEL is emitted. According to an example, the active layer can comprise confining means, such as a single quantum well or multiple quantum wells. It is, for example, constituted by an alternation of layers of GaN and of InGaN having respective thicknesses from 5 to 20 nm (for example 8 nm) and from 1 to 10 nm (for example 2.5 nm). The layers of GaN can be doped, for example n-type or p-type doped. According to a further example, the active layer can comprise a sole layer of InGaN, for example with a thickness greater than 10 nm.

The intermediate layer, for example p-type doped, can correspond to a semiconductor layer or to a stack of semiconductor layers and allow the formation of a p-n or pin junction, the active layer being comprised between the p-type intermediate layer and the n-type wire 16 of the p-n or pin junction. The coupling layer can correspond to a semiconductor layer or to a stack of semiconductor layers and allows the formation of an ohmic contact between the intermediate layer and the electrode 24. For instance, the coupling layer can be very heavily doped with the type opposite that of the wire 16, until a degeneration of the one or more semiconductor layers, for example p-typed doped at a concentration greater than or equal to $10^{20}$ atoms/cm$^3$. The stack of semiconductor layers can comprise a layer for blocking electrons formed from a ternary alloy, for example made of aluminium gallium nitride (AlGaN) or of aluminium indium nitride (AlInN) in contact with the active layer and the intermediate layer, in order to ensure a good distribution of the electric carriers in the active layer.

Each electrode 24, 30 is adapted to bias the active layer of the light-emitting diode DEL and to let through the electromagnetic radiation emitted by the light-emitting diode DEL. The material forming each electrode 24, 30 can be a conductive and transparent material such as indium tin oxide (or ITO), pure zinc oxide, aluminium-doped zinc oxide, gallium-doped zinc oxide, graphene, or silver nanowires. For instance, each electrode layer 24, 30 has a thickness comprised between 5 nm and 200 nm, preferably between 30 nm and 100 nm.

Each isolating layer 14, 28 and 32 can be made of a dielectric material, for example made of silicon oxide (SiO$_2$), of silicon nitride (Si$_x$N$_y$, where x is approximately equal to 3 and y is approximately equal to 4, for example Si$_3$N$_4$), of silicon oxynitride (in particular with the general formula SiO$_x$N$_y$, for example Si$_2$ON$_2$), of aluminium oxide (Al$_2$O$_3$), of hafnium oxide (HfO$_2$) or of diamond. For instance, the thickness of each isolating layer 14 and 28 is comprised between 5 nm and 500 nm, for example equal to approximately 30 nm. The layer 32 can, moreover, be made of an organic material, for example an organic polymer, or of an inorganic polymer, for example silicon. For instance, the thickness of the isolating layer 32, when it is present, is comprised between 200 nm and 5 µm, for example equal to approximately 1 µm.

The encapsulation block 25 can be made of an organic material or an inorganic material at least partially transparent to the radiation emitted by the light-emitting diode DEL. The maximum thickness of the encapsulation block 25, measured perpendicularly to the face 12, is preferably comprised between 1 µm and 30 µm. The width of the encapsulation block 25 can correspond to the diameter of the circle circumscribing the encapsulation block in a top view. According to an embodiment, the width of the encapsulation block 25 is comprised between 3 µm and 30 µm. According to an embodiment, the upper face 26 is flat and parallel to the face 12. According to an embodiment, the lateral wall 18 is perpendicular to the face 12. As a variant, the lateral wall 18 can be inclined with respect to the face 12.

The encapsulation block 25 can be realised from an at least partially transparent organic material. The encapsulation block 25 can comprise a matrix of an at least partially transparent organic or inorganic material in which particles of a dielectric material are possibly distributed. The refractive index of the dielectric material composing the particles is strictly higher than the refractive index of the material composing the matrix. According to an example, the encapsulation block 25 comprises a matrix made of silicone, also known as polysiloxane, or a matrix made of an epoxide polymer and comprises, moreover, particles of a dielectric material distributed in the matrix. The particles are composed of any type of material with which it is possible to obtain relatively spherical nanoscale particles and having an adapted refractive index. For instance, the particles can be composed of titanium oxide ($TiO_2$), of zirconium oxide ($ZrO_2$), of zinc sulphide (ZnS), of lead sulphide (PbS) or of amorphous silicon (Si). What is known as the average diameter of a particle is the diameter of the sphere with the same volume. The average diameter of the particles of the dielectric material is comprised between 2 nm and 250 nm. The concentration by volume of the particles with respect to the total weight of the encapsulation layer 34 is comprised between 1% and 50%. According to a further example, the encapsulation block 25 can be composed of one of the materials described in the foregoing in relation to the isolating layers 14, 28 and 32.

When the layer 32 is not present, the encapsulation block has a refractive index comprised between 1.3 and 1.6. When the layer 32 is present, the encapsulation block 25 has a refractive index comprised between 1.8 and 2.2 and the isolating layer 32 has a refractive index comprised between 1.3 and 1.6.

The optoelectronic device according to the embodiment described in the foregoing advantageously makes it possible to increase the overall extraction efficiency of the optoelectronic device 5, i.e. escaping from the optoelectronic device 5 via the front face 36. In order to be perceived by an observer looking at the optoelectronic device 5, the light must leave the encapsulation blocks 25 via the front face 36. In order to improve the extraction efficiency of the optoelectronic device 5, a surface processing, known as texturing, can be applied to the front face 36 so as to form relief patterns on the face 36.

Simulations were performed for the optoelectronic device 5 illustrated in FIG. 1. For these simulations, the encapsulation block 25, covered by the electrode 30, had an outside diameter of 5 µm, the support 10 being made of aluminium, the electrode 24 was made of TCO, the electrode 30 was made of TCO, the wire 16 and the casing 22 were made of GaN, had a height of 5 µm and an outside diameter of 1.25 µm. When the layer 32 is present, its refractive index is selected equal to 1.45.

Figure 2:
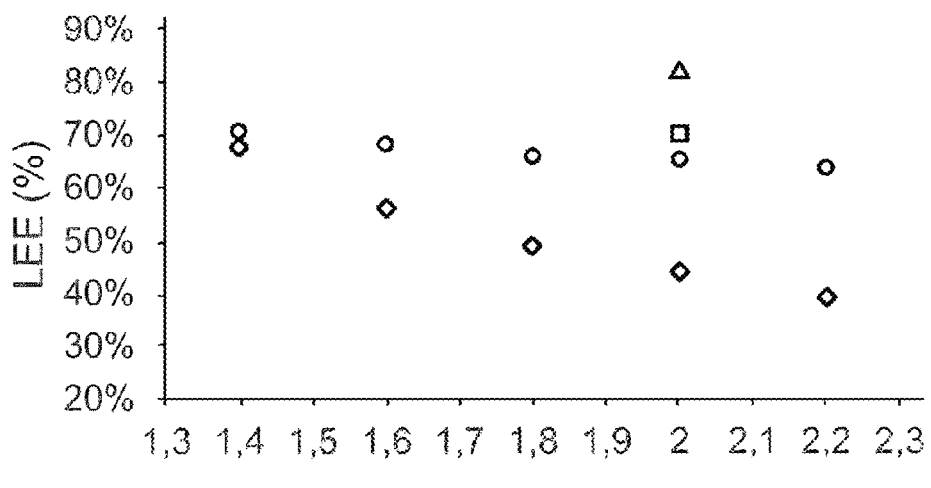
FIG. 2 illustrates progression curves of the light extraction efficiency of the optoelectronic device shown in FIG. 1 as a function of the refractive index of an element of the device.

FIG. 2 illustrates progression curves of the light extraction efficiency LEE of the optoelectronic device 5 shown in FIG. 1 as a function of the refractive index n of the encapsulation block 25. The simulations indicated by diamonds were obtained in the absence of the layer 32, while considering that the support 10 made of aluminium forms a mirror with a specular reflection. The simulations indicated by circles were obtained in the absence of the layer 32, while considering that the support 10 has a Lambertian reflection. The simulation indicated by the square was obtained in the presence of the layer 32, while considering that the support 10 made of aluminium forms a mirror with a specular reflection. The simulation indicated by the triangle was obtained in the presence of the layer 32, while considering that the support 10 has a Lambertian reflection.

Figure 3:
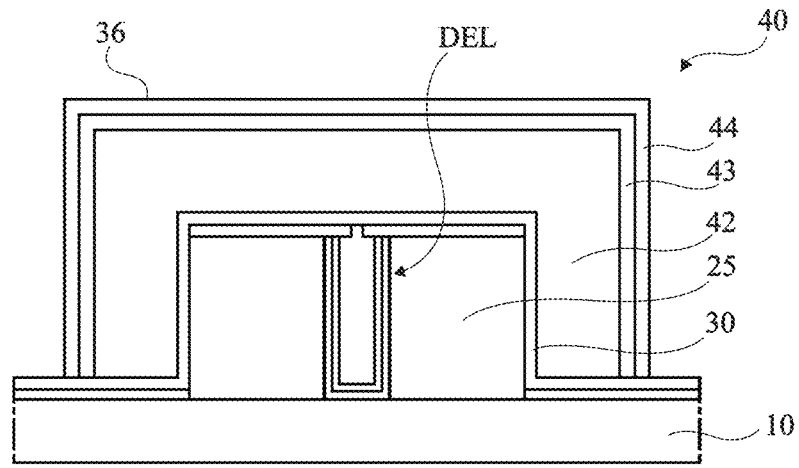
FIG. 3 illustrates a further embodiment of an optoelectronic device comprising microwires or nanowires.

FIG. 3 is a partial and schematic sectional view of a further embodiment of an optoelectronic device 40 comprising microwires or nanowires. The optoelectronic device 40 comprises the entirety of the elements of the optoelectronic device 5 illustrated in FIG. 1 and further comprises, at least for certain light-emitting diodes DEL, a photoluminescent layer 42 covering the encapsulation block 25. The photoluminescent layer 42 can further play the role of the layer 32 described in the foregoing. The range of refractive indexes of the photoluminescent layer 42 is thus the same as described in the foregoing for the layer 32. The optoelectronic device 40 can further comprise a transparent layer 43 covering the photoluminescent layer 42 and a filter 44 covering the layer 43 configured to block the transmission of radiation in a given wavelength range. The filter 44 can correspond to a coloured layer or to a stack of layers with different refractive indexes forming a Bragg filter. The photoluminescent layer 42 can be a conformal layer. By means of the filters 44, it is possible to adjust the wavelength range of the radiation that escapes from the photoluminescent layer 42. The layer 43 has a refractive index as close as possible to 1, preferably lower than the refractive index of the layer 42, preferably lower than 1.5, so as to reduce, or eliminate, the reflections on the filter 44 of the rays escaping the photoluminescent layer 42. The layer 43 is, for example, realised from $MgF_2$, from a polymer, for example an acrylate, or corresponds to a film of air.

The photoluminescent layer 42 can comprise luminophores adapted, when they are excited by the light emitted by the associated light-emitting diode DEL, to emit light at a wavelength different from the wavelength of the light emitted by the associated light-emitting diode DEL. The thickness of the photoluminescent layer 42 can be comprised between 4 µm and 40 µm.

According to an embodiment, the photoluminescent layer 42 comprises particles of at least one photoluminescent material. An example of a photoluminescent material is the yttrium aluminium garnet (YAG) activated by the trivalent cerium ion, also known as YAG:Ce or YAG:Ce3+. The average size of the particles of the classic photoluminescent materials is generally greater than 5 µm.

According to an embodiment, each photoluminescent layer 42 comprises a matrix in which nanoscale single-crystalline particles of a semiconducting material are dispersed, also called semiconductor nanocrystals or nanoluminophore particles in the following. The internal quantum efficiency QYint of a photoluminescent material is equal to the ratio between the number of photons emitted and the number of photons absorbed by the photoluminescent substance. The internal quantum efficiency QYint of the semiconductor nanocrystals is higher than 5%, preferably higher than 10%, more preferably higher than 20%.

According to an embodiment, the average size of the nanocrystals is in the range of 0.5 nm and 1000 nm, preferably from 0.5 nm to 500 nm, even more preferably from 1 nm to 100 nm, in particular from 2 nm to 30 nm. For dimensions less than 50 nm, the photoconversion properties of the semiconductor nanocrystals essentially depend on quantum confinement phenomena. The semiconductor nanocrystals thus correspond to quantum dots (in the case of a confinement in the three dimensions) or to quantum wells (in the case of a confinement in two dimensions).

According to an embodiment, the semiconductor material of the semiconductor nanocrystals is chosen from the group comprising cadmium selenide (CdSe), indium phosphide (InP), cadmium sulphide (CdS), zinc sulphide (ZnS), zinc selenide (ZnSe), cadmium telluride (CdTe), zinc telluride (ZnTe), cadmium oxide (CdO), zinc cadmium oxide (ZnCdO), cadmium zinc sulphide (CdZnS), cadmium zinc selenide (CdZnSe), silver indium sulphide ($AgInS_2$), perovskites of the type $PbScX_3$, where X is a halogen atom, in particular iodine (I), bromine (Br) or chlorine (Cl), and a mixture of at least two of these compounds. According to an embodiment, the semiconductor material of the semiconductor nanocrystals is chosen from the materials cited in the publication by Blevenec and al. in Physica Status Solidi (RRL)—Rapid Research Letters Volume 8, No. 4, pages 349-352, April 2014.

According to an embodiment, the dimensions of the semiconductor nanocrystals are chosen in accordance with the desired wavelength of the radiation emitted by the semiconductor nanocrystals. For instance, CdSe nanocrystals the average size of which is in the order of 3.6 nm are adapted to convert blue light into red light and CdSe nanocrystals the average size of which is in the order of 1.3 nm are adapted to convert blue light into green light. According to a further embodiment, the composition of the semiconductor nanocrystals is chosen in accordance with the desired wavelength of the radiation emitted by the semiconductor nanocrystals.

The matrix is made of a material at least partly transparent to the radiation emitted by the light-emitting diode DEL and to the radiation emitted by the photoluminescent particles. The matrix is, for example, made of silica. The matrix is, for example, made of any at least partly transparent polymer, in particular of silicone, of epoxy or of polyacetic acid (PLA). The matrix can be made of an at least partly transparent polymer used with three-dimensional printers, such as PLA. According to an embodiment, the matrix contains from 2% to 90%, preferably from 10% to 60%, by weight nanocrystals, for example approximately 30% by weight nanocrystals. The matrix can further contain scattering particles, in particular $TiO_2$ particles, having, for example, a diameter comprised between 100 nm and 300 nm.

Simulations were performed for the optoelectronic device 40 illustrated in FIG. 3 with the simulation parameters described in the foregoing for obtaining the curves shown in FIG. 2.

Figure 4:
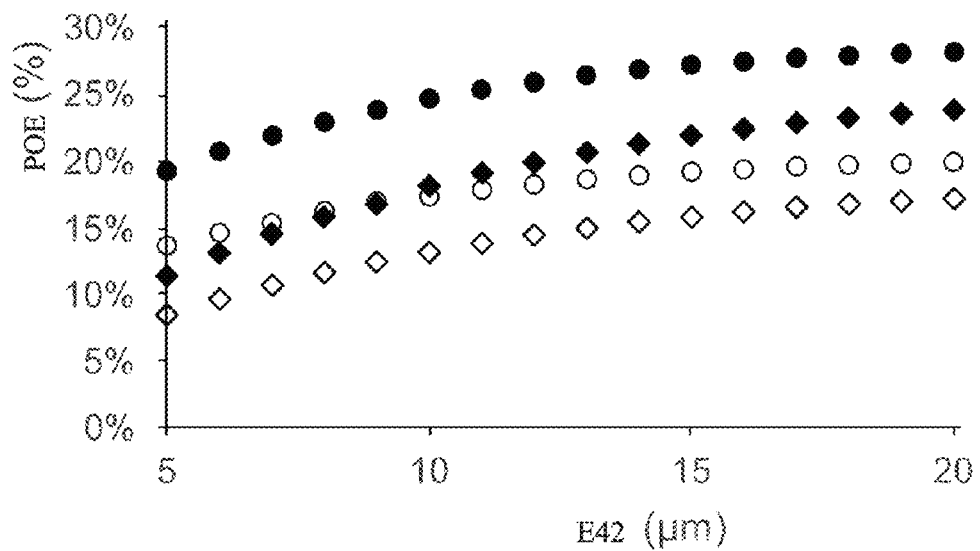
FIG. 4 illustrates progression curves of the light extraction efficiency of the optoelectronic device shown in FIG. 3 as a function of the thickness of the photoluminescent layer.

FIG. 4 illustrates progression curves of the pixel optical efficiency POE of the optoelectronic device 40 shown in FIG. 3 as a function of the thickness E42 of the photoluminescent layer 42. The pixel optical efficiency corresponds to the ratio between the optical power emitted toward the free space (including the conversion losses) and the optical power generated by the light-emitting diode. The simulations indicated by diamonds were obtained when the support 10 corresponded to an opaque and matt material between the light-emitting diodes, i.e. a material having a substantially Lambertian reflection. The simulations indicated by circles were obtained when the support 10 corresponded to a mirror between the light-emitting diodes, i.e. having a substantially specular reflection. The curves indicated by empty circles or diamonds were obtained when the refractive index of the layer 43 was equal to 1.5 and the curves indicated by solid circles or diamonds were obtained when the refractive index of the layer 43 was equal to 1. The closer the refractive index of the isolating layer 43 is to 1, the more the pixel optical efficiency POE is increased. It further appears that the contribution of the variations in the refractive indexes of the layer 43 to the POE decreases when the thickness of the photoluminescent layer increases 42. It further appears that for a thickness of the photoluminescent layer 42 greater than approximately 15 µm, the variations in the thickness of the photoluminescent layer 42 have little influence on the POE.

Figure 5:
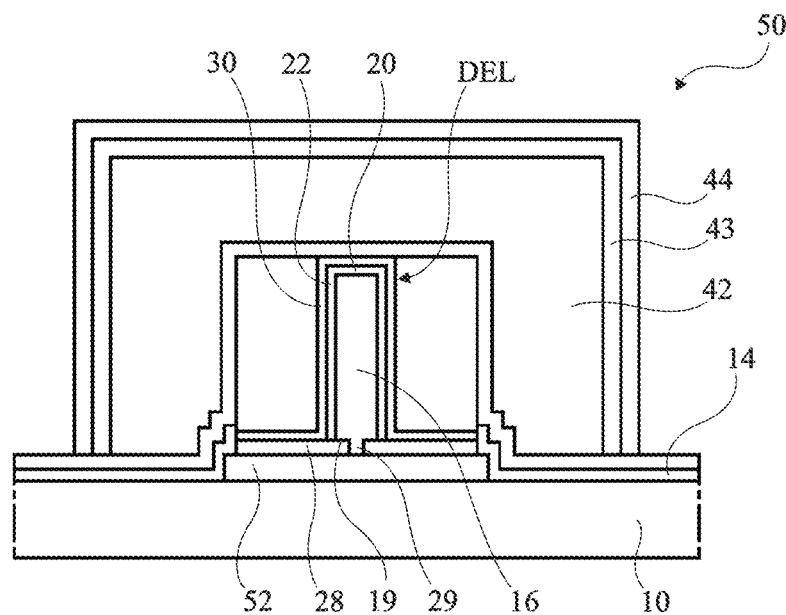
FIG. 5 illustrates a further embodiment of an optoelectronic device comprising microwires or nanowires.

FIG. 5 is a partial and schematic sectional view of a further embodiment of an optoelectronic device 50 comprising microwires or nanowires. The optoelectronic device 50 comprises the entirety of the elements of the optoelectronic device 40 illustrated in FIG. 3 with the difference that, for each light-emitting diode DEL, the device 50 further comprises a conductive pad 52 placed between the light-emitting diode DEL and the support 10, that the isolating layer 14 covers the lateral edges of the conductive pad 52, that the casing 22 and the electrode 30 do not cover the lower end wall 19 of the wire 16 but the upper end wall 20 of the wire 16, that the isolating layer 28 is placed between the conductive pad 52 and the electrode layer 30, and that the protuberance 29 connects the wire 16 to the conductive pad 52.

Figure 6:
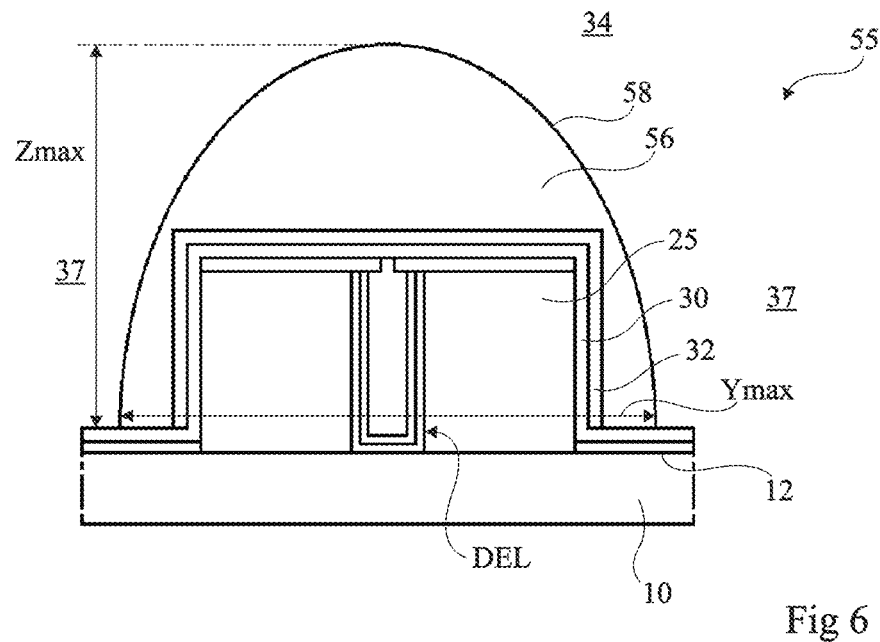
FIG. 6 illustrates a further embodiment of an optoelectronic device comprising microwires or nanowires.

FIG. 6 is a partial and schematic sectional view of a further embodiment of an optoelectronic device 55 comprising microwires or nanowires. The optoelectronic device 55 comprises the entirety of the elements of the optoelectronic device 5 illustrated in FIG. 1 and comprises, moreover, for each light-emitting diode DEL, a lens 56 that completely covers the encapsulation block 25. In particular, the lens 56 covers the upper face of the encapsulation block 25 and the lateral wall of the encapsulation block 25. According to an embodiment, the lens 56 comprises an outside face 58 in contact with the air 34 that has at least partly substantially the form of a parabola in a cross-sectional plane containing the axis of the wire 16. The interstice of air 37 is present and placed between two lenses 56 covering the light-emitting diodes DEL of a pair of adjacent light-emitting diodes.

The lens 56 can be realised from an organic or inorganic material, in particular the materials described in the foregoing in order to form the encapsulation block 25 and/or the matrix of the photoluminescent layer 42. With the lens 56, it is possible to improve the directivity of the light emitted by the optoelectronic device 55. The thickness Zmax of the lens 56 corresponds to the maximum distance between the electrode layer 30 and the face 58. The width Ymax of the lens 56 corresponds to the maximum distance of the lens 56 measured parallel to the face 12 of the support 10. According to an embodiment, the thickness Zmax is comprised between 8 µm and 50 µm. According to an embodiment, the width Ymax is comprised between 8 µm and 50 µm. Preferably, the refractive index of the lens 56 is comprised between 1.4 and 1.5.

According to an embodiment, the support 10 is reflective for the radiation emitted by the light-emitting diode DEL and the lateral wall of the lens 56, on a lower portion of the lens 56, is surrounded by a layer reflective for the radiation emitted by the light-emitting diode DEL.

Simulations were performed for the optoelectronic device 55 illustrated in FIG. 6 with the simulation parameters described in the foregoing for obtaining the curves shown in FIG. 2. The lens 56 was realised from a material with a refractive index equal to 1.45. For the simulations, the maximum width Ymax of the lens 56 was equal to the maximum thickness Zmax of the lens 56.

Figure 7:
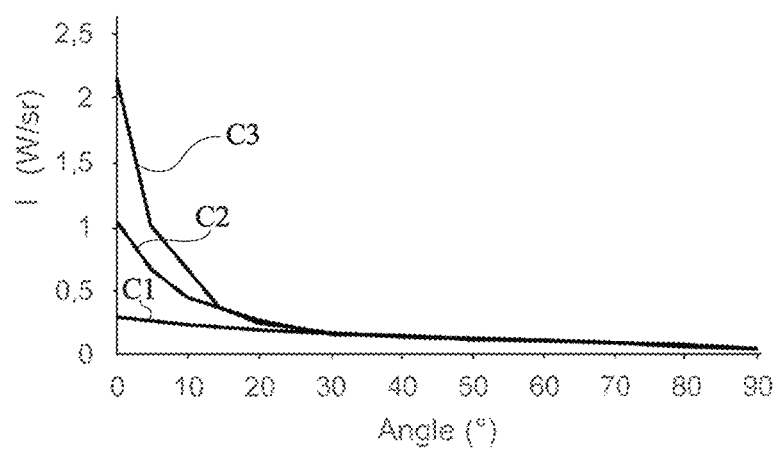
FIG. 7 illustrates progression curves of the light intensity emitted by the optoelectronic device shown in FIG. 6 according to a given direction as a function of the inclination of the given direction in relation to the front face of the device for various lens thicknesses.

FIG. 7 illustrates progression curves C1, C2 and C3 of the energetic intensity of the radiation emitted by the optoelectronic device 55 shown in FIG. 6 in accordance with a given direction as a function of the inclination (Angle) of said direction in relation to the upper face 12 of the support 10 when the lens 56 has a maximum thickness Zmax equal to respectively 6 µm, 12 µm and 18 µm. As is evident in FIG. 7, the energetic intensity at the low incidences, i.e. for a radiation escaping in a manner substantially orthogonal to the face 12 of the support 10, increases when the maximum thickness Zmax of the lens 56 increases.

Figure 8:
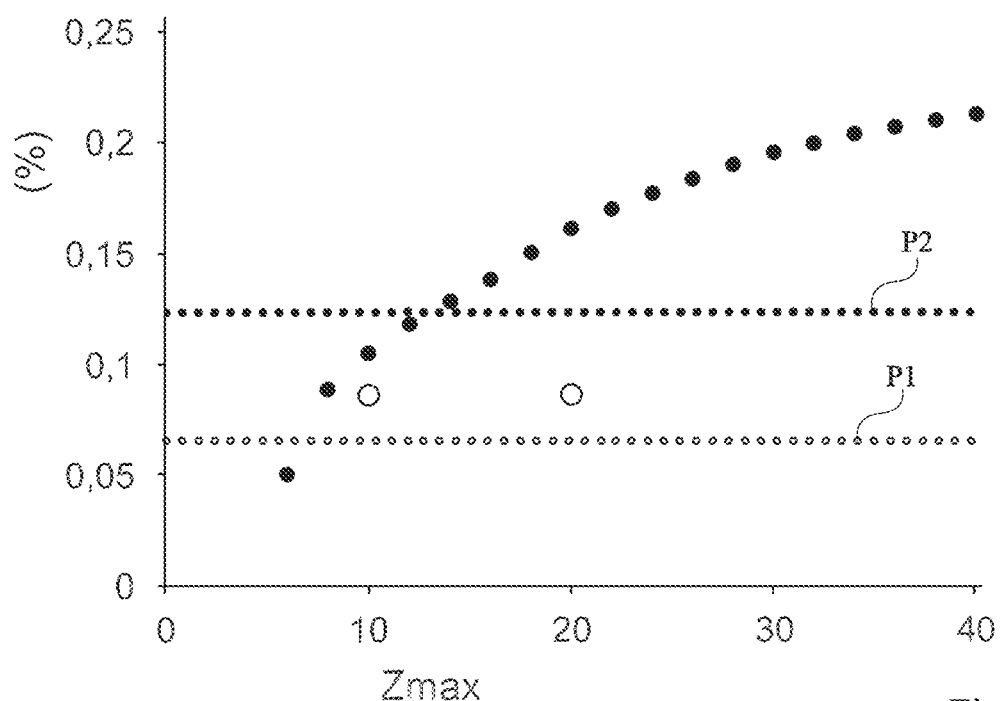
FIG. 8 illustrates a progression curve of the light power emitted by the optoelectronic device shown in FIG. 6 in an emission cone a semi-angle of which in relation at the summit is 20° as a function of the thickness of the lenses.

FIG. 8 illustrates a progression curve of the light power P emitted by the optoelectronic device 55 shown in FIG. 6 in an emission cone, with an axis perpendicular to the face 12 of the support 10 and the semi-angle of which at the summit is 20°, as a function of the maximum thickness Zmax of the lens 56. The simulations indicated by black solid large circles were obtained with a lens 56 the outside face 58 of which corresponded to a paraboloid. As a comparison, two simulations indicated by empty large circles were obtained with lenses of a pyramidal shape. As is evident in FIG. 8, the light power in the emission cone increases when the maximum thickness Zmax of the lens 56 increases. As a comparison, the straight line P1 illustrated by small empty circles illustrates the light power P emitted, in the emission cone defined in the foregoing, in the absence of the lens 56 and the straight line P2 illustrated by small solid circles illustrates the light power P that would be emitted, in the emission cone defined in the foregoing, by a Lambertian emitter.

Figure 9:
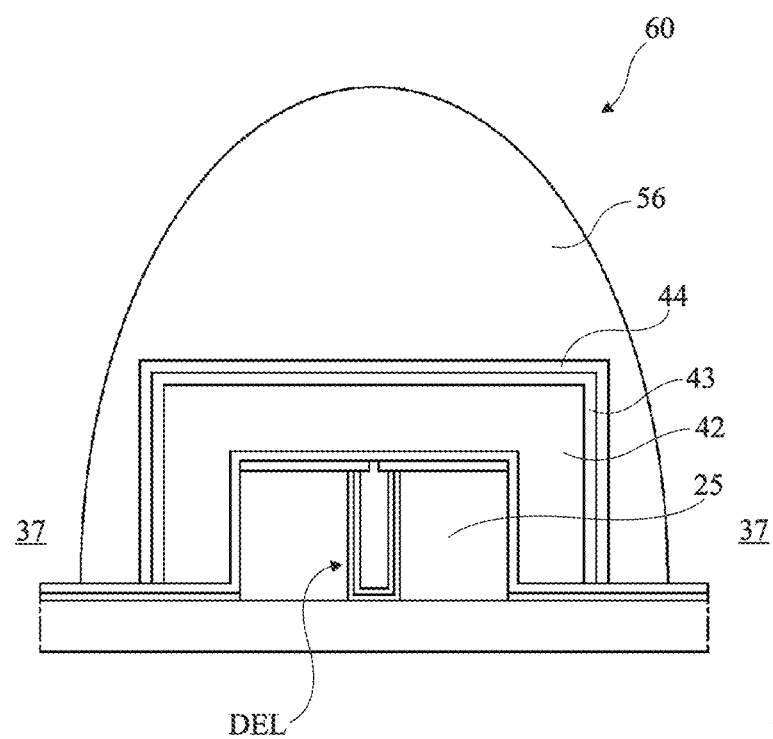
FIG. 9 illustrates a further embodiment of an optoelectronic device comprising microwires or nanowires.

FIG. 9 is a partial and schematic sectional view of a further embodiment of an optoelectronic device 60 comprising microwires or nanowires. The optoelectronic device 60 comprises the entirety of the elements of the optoelectronic device 40 illustrated in FIG. 3 and comprises, moreover, the lens 56 of the optoelectronic device 55 illustrated in FIG. 6. In this embodiment, the lens 56 completely covers the encapsulation block 25, the photoluminescent layer 42 being placed between the encapsulation block 25 and the lens 56.

Figure 10:
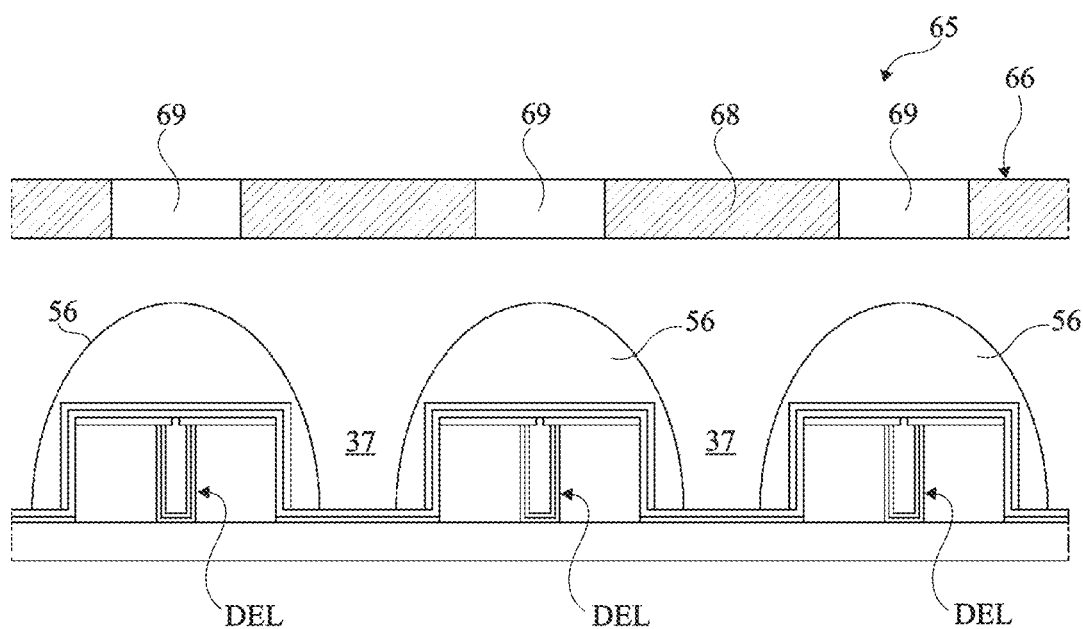
FIG. 10 illustrates a further embodiment of an optoelectronic device comprising microwires or nanowires.

FIG. 10 is a partial and schematic sectional view of a further embodiment of an optoelectronic device 65 comprising microwires or nanowires. The optoelectronic device 65 comprises the entirety of the elements of the optoelectronic device 55 illustrated in FIG. 6, three light-emitting diodes DEL being illustrated, and comprises, moreover, an angular filter 66 covering the light-emitting diodes DEL. The angular filter 66 is configured to block the rays emitted by the light-emitting diodes DEL and the rays of the ambient light outside the optoelectronic device 65 the incidence of which with respect to a reference direction, for example a direction orthogonal to the face 12 of the support 10, is in a first incidence range and lets through rays the direction of which is in at least a second incidence range distinct from the first incidence range. In the present embodiment, the angular filter 66 comprises a layer 68 opaque to the visible light, preferably absorbing the visible light, and comprising through openings 69. The through openings 69 can be formed in vertical alignment with the light-emitting diodes DEL according to the reference direction.

Preferably, each light-emitting diode DEL is covered with a lens 56 as illustrated in FIG. 10. The angular filter 66 is kept apart from the support 10 by spacers that are not illustrated, a film of air 34 being present between the angular filter 66 and the lenses 56. As a considerable part of the radiation that escapes from the lenses 56 has a low incidence with respect to the reference direction, the main part of this radiation passes the angular filter 66 without being blocked. Conversely, the main part of the radiation due to the ambient light is blocked by the angular filter 66. This allows a reduction of undesirable reflections of the ambient light on reflective elements of the optoelectronic device 65, for example metal tracks. This allows, moreover, an improvement of the contrast of the optoelectronic device 65.

Figure 11:
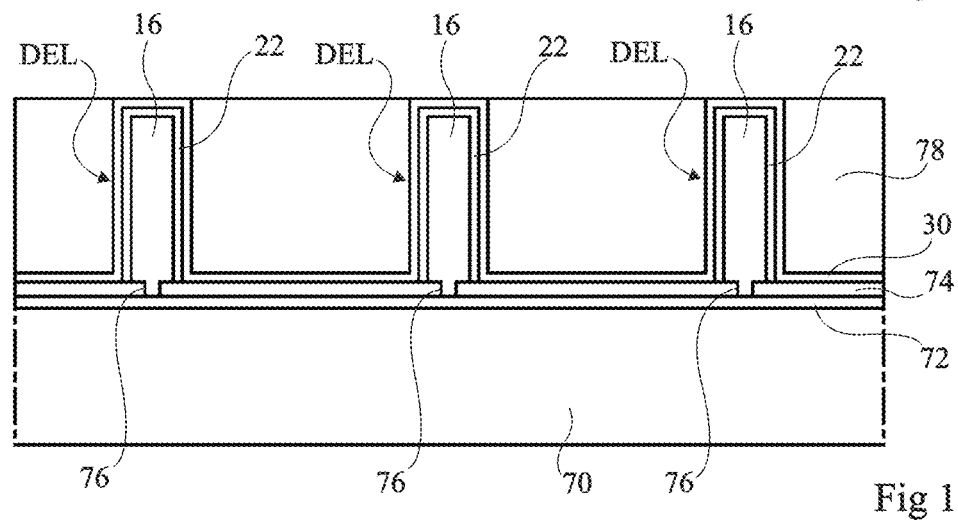
FIG. 11 depicts a step of an embodiment of a method for manufacturing the optoelectronic device illustrated in FIG. 5.

FIGS. 11 to 20 are partial and schematic sectional views of structures obtained in successive steps of an embodiment of a method for manufacturing the optoelectronic device 50 illustrated in FIG. 5. The method comprises the following steps:

1) Formation of the light-emitting diodes DEL (FIG. 11). The light-emitting diodes DEL can be formed on a substrate 70 covered by a nucleation layer 72, also known as germination layer, and by an electrically isolating layer 74 covering the nucleation layer 72 and comprising through openings 76 exposing parts of the nucleation layer 72 at the desired sites of formation of the light-emitting diodes DEL. The germination layer 72 is a layer that stimulates the growth of the wires. The germination layer 72, the wires 16, the casings 22 and the electrode layer 30 can be deposited by a method of the type chemical vapour deposition (CVD) or metal-organic chemical vapour deposition (MOCVD), also known by the name metal-organic vapour phase epitaxy (MOVPE). However, methods such as molecular-beam epitaxy (MBE), gas source MBE (GSMBE), organometallic MBE (MOMBE), plasma-assisted MBE (PAMBE), atomic layer epitaxy (ALE), hydride vapour phase epitaxy (HVPE) can be used or a method of atomic layer deposition (ALD). Moreover, methods such as evaporation or reactive sputtering can be used. A more detailed method for manufacturing light-emitting diodes is described in the U.S. Pat. No. 9,537,044. A layer 78 of the material composing the encapsulation blocks 25 is deposited on the entirety of the structure, for example by a spin deposition method, by a jet printing method or by a screen printing method. When the encapsulation layer 78 is an oxide, it can be deposited by CVD. Portions of the electrode layer 30 are exposed at the surface of the encapsulation layer 78.

Figure 12:
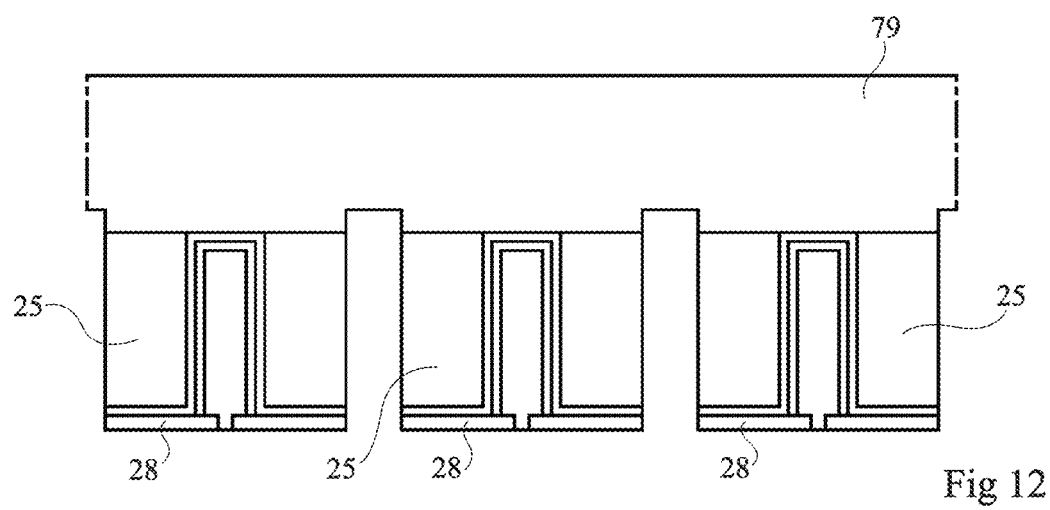
FIG. 12 depicts a subsequent step of the manufacturing method.

2) Fixation of the structure obtained in the preceding step to a handle 79, removal of the substrate 70 and of the nucleation layer 72 and partial cutting out of the obtained structure, on the side of the isolating layer 74, in order to delimit the encapsulation blocks 25 and the isolating layers 28 (FIG. 12). The fixation to the handle 79 can be realised by molecular bonding or by using an intermediate bonding material. The removal of the substrate 70 can be realised by chemical-mechanical planarization (CMP). The cuts allowing the delimitation of the encapsulation blocks 25 and isolating layers 28 can be realised by etching or by sawing.

Figure 13:
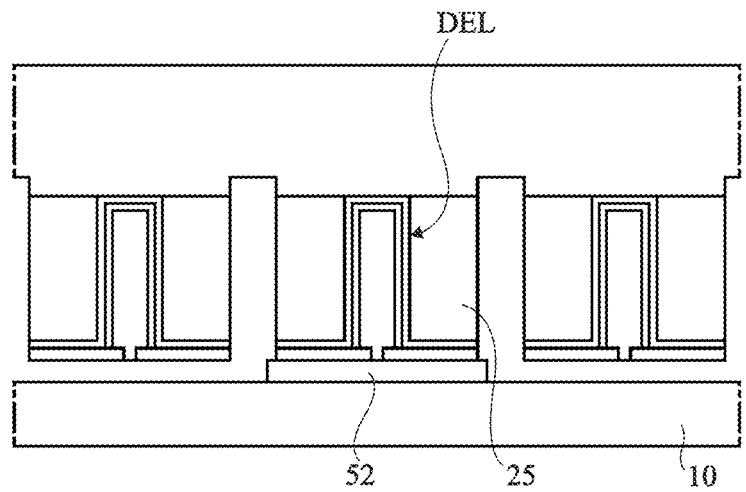
FIG. 13 depicts a subsequent step of the manufacturing method.
Figure 14:
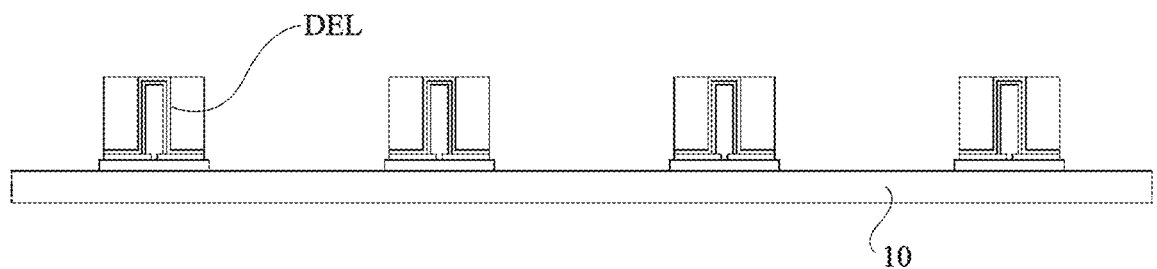
FIG. 14 depicts a subsequent step of the manufacturing method.

3) Fixation to the support 10 of light-emitting diodes of the structure obtained in the preceding step (FIG. 13). The fixation can be realised by a coupling of the "flip-chip" type. According to a further embodiment, the fixation can be realised by direct bonding, also called molecular bonding, of the light-emitting diodes to the conductive pads 52 provided on the support 10. As illustrated in FIG. 13, only certain light-emitting diodes of the structure illustrated in FIG. 12 are fixed to the support 10. FIG. 14 illustrates the result obtained once all the light-emitting diodes are fixed at the desired sites on the support 10.

Figure 15:
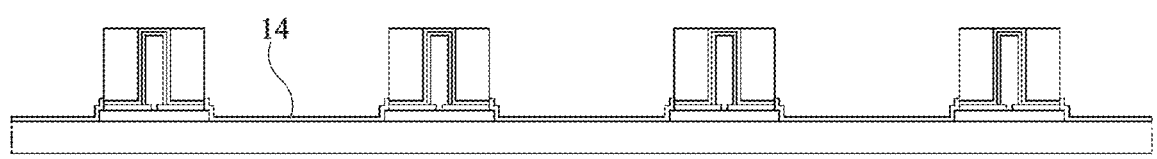
FIG. 15 depicts a subsequent step of the manufacturing method.

4) Formation of the isolating layer 14 (FIG. 15). This can be realised by a conformal deposition of the isolating layer over the entirety of the structure illustrated in FIG. 14 and the removal of portions of this conformal layer in order to form the isolating layer 14.

Figure 16:
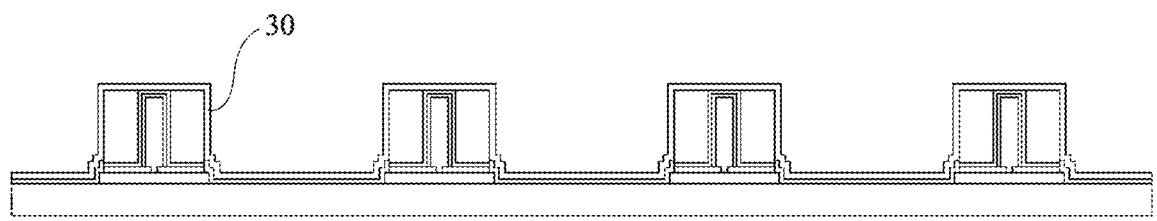
FIG. 16 depicts a subsequent step of the manufacturing method.

5) Formation of the electrode layer 30, for example by conformal deposition (FIG. 16).

Figure 17:
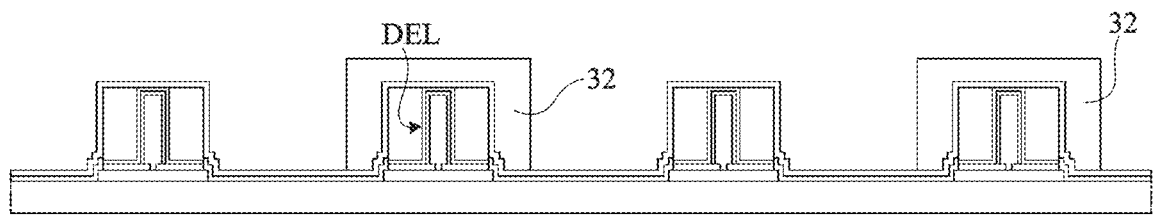
FIG. 17 depicts a subsequent step of the manufacturing method.
Figure 18:
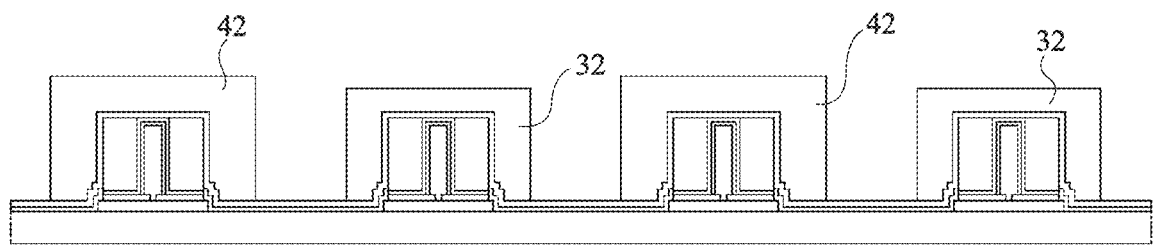
FIG. 18 depicts a subsequent step of the manufacturing method.

6) Possible formation for the light-emitting diodes DEL not comprising a photoluminescent layer 42 of the layer 32 covering the electrode layer 30 (FIG. 17).

7) Formation of the photoluminescent layers 42 for the other light-emitting diodes DEL (FIG. 18), for example by direct printing of the material composing the photoluminescent layers 42 at the desired sites, for example by ink-jet printing, printing by aerosol, microstamping, photoetching, screen printing, flexography, spray coating, or deposition of drops.

Figure 19:
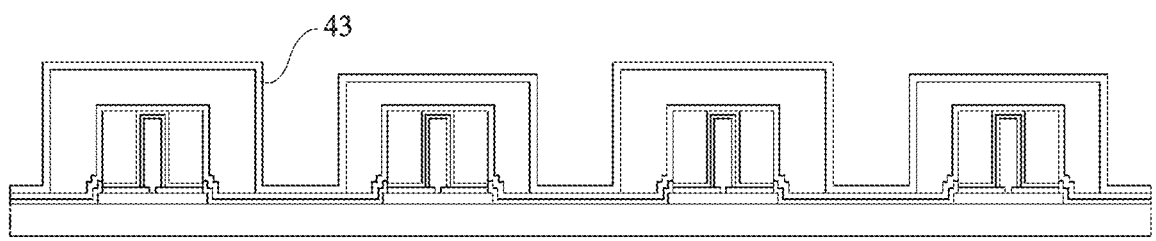
FIG. 19 depicts a subsequent step of the manufacturing method.

8) Formation of the isolating layer 43, for example by conformal deposition (FIG. 19).

Figure 20:
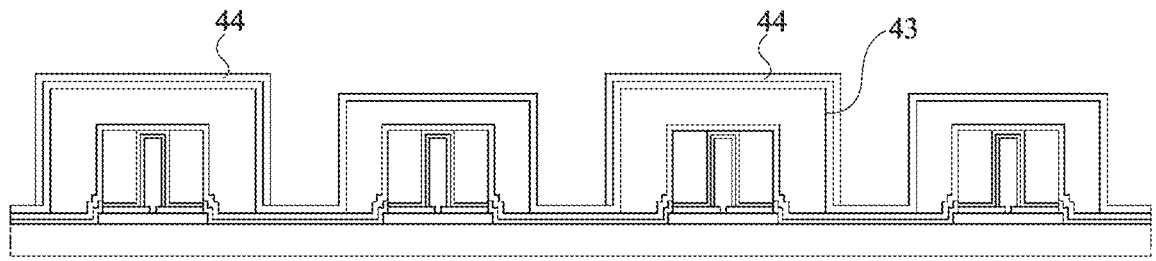
FIG. 20 depicts a subsequent step of the manufacturing method.

9) Formation of the filters 44 (FIG. 20).

In the case of optoelectronic devices comprising lenses 56 covering the light-emitting diodes, the lenses 56 can be formed by the deposition of a layer of the material composing the lenses on the light-emitting diodes and the etching of this layer or the forming of this layer in order to obtain the lenses 56.

Figure 21:
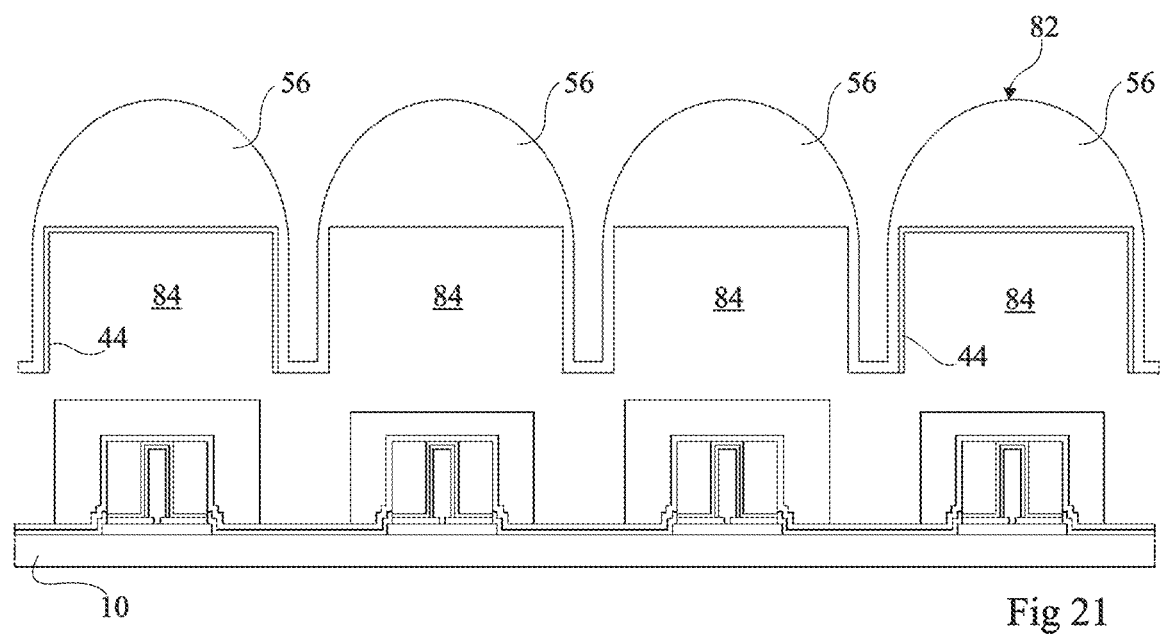
FIG. 21 depicts a step of an embodiment of a method for manufacturing the optoelectronic device similar to the device illustrated in FIG. 9.
Figure 22:
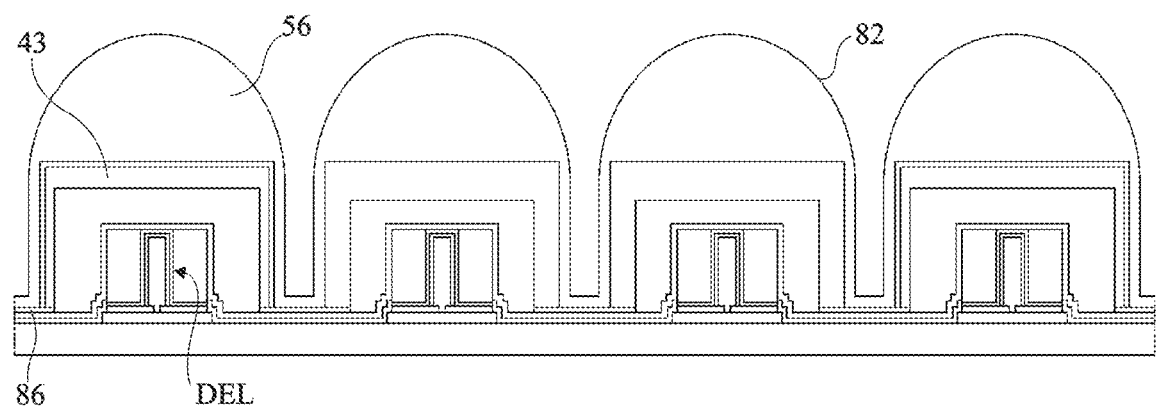
FIG. 22 depicts a subsequent step of the manufacturing method.

FIGS. 21 and 22 are partial and schematic sectional views of structures obtained in successive steps of an embodiment of a method for manufacturing an optoelectronic device that corresponds to a variant of the optoelectronic device 60 illustrated in FIG. 9. In this embodiment, the lenses 56 are formed beforehand separately from the structure comprising the light-emitting diodes. In FIG. 21, the lenses 56 form a monobloc structure 82, for example obtained by moulding. Each lens 56 comprises a slot 84 intended to receive a light-emitting diode DEL. The filters 44 can be formed in certain slots. The monobloc structure 82 is then fixed to the support 10 (FIG. 22), for example by using a bonding material 86. In the present embodiment, the dimensions of the slots 84 are larger than the dimensions of the light-emitting diodes DEL so that, when the monobloc structure 82 is fixed to the support 10, there remains an interstice of air between each lens 56 and the photoluminescent layer 42 that forms the layer 43 described in the foregoing.

Figure 23:
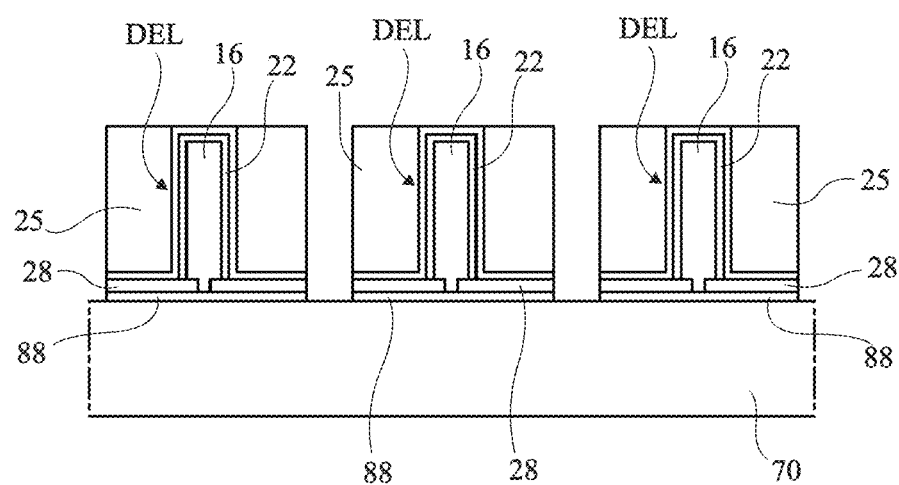
FIG. 23 depicts a step of an embodiment of a method for manufacturing the optoelectronic device illustrated in FIG. 1.
Figure 24:
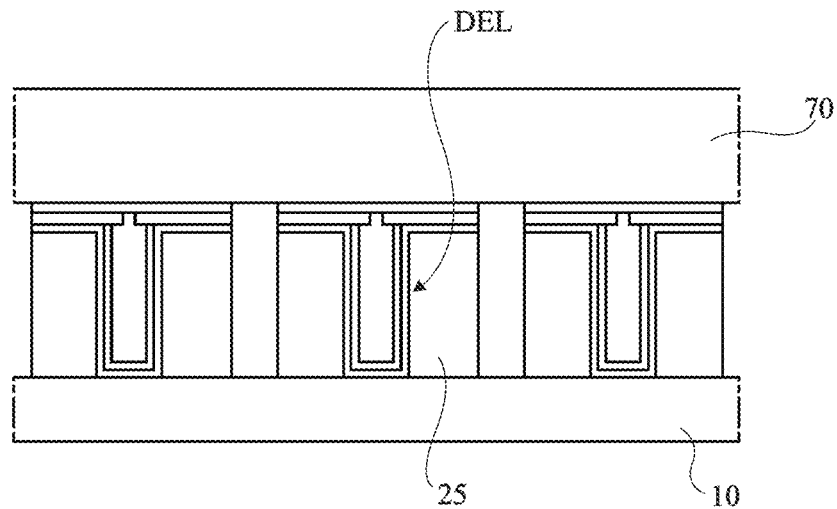
FIG. 24 depicts a subsequent step of the manufacturing method.
Figure 25:
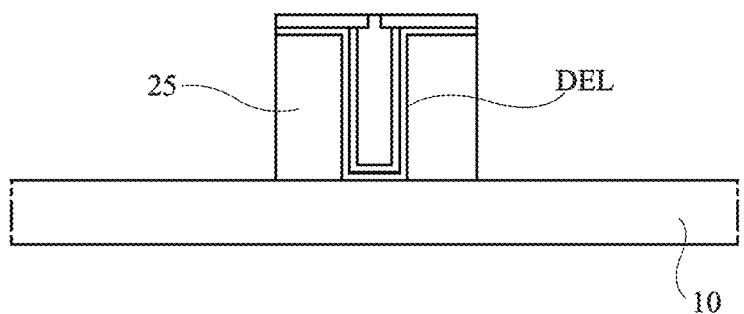
FIG. 25 depicts a subsequent step of the manufacturing method.

FIGS. 23 to 25 are partial and schematic sectional views of structures obtained in successive steps of an embodiment of a method for manufacturing the optoelectronic device 5 illustrated in FIG. 1. The method comprises the following steps:

1)′ Formation of the light-emitting diodes DEL in a manner analogous to what was described in the foregoing in step 1) in relation to FIG. 11.

2)′ Partial cutting out of the obtained structure, on the side of the isolating layer 74, in order to delimit the encapsulation blocks 25, the isolating layers 28 and portions 88 of the nucleation layer 72 (FIG. 23). The cuts can be realised by etching or by sawing.

3)′ Fixation to the support 10 of light-emitting diodes of the structure obtained in the preceding step (FIG. 24). The fixation can be realised as described in the foregoing in step 3) in relation to FIG. 13.

4)′ Selective freeing of the substrate 70 of the light-emitting diodes DEL fixed to the support 10 and removal of the portions 80 of the nucleation layer.

The subsequent steps of the method can correspond to the steps described in the foregoing in relation to FIGS. 14 to 22.

Various embodiments and variants have been described. Those skilled in the art will understand that certain features of these embodiments can be combined and other variants will readily occur to those skilled in the art. In particular, the structure of the light-emitting diode DEL of optoelectronic device 50 illustrated in FIG. 5 can be implemented with the optoelectronic device 5 illustrated in FIG. 1, the optoelectronic device 55 illustrated in FIG. 6, the optoelectronic device 60 illustrated in FIG. 9 and the optoelectronic device 65 illustrated in FIG. 10. Moreover, even though in the previously disclosed embodiments, each encapsulation block 25 is shown covering a single light-emitting diode DEL, it is clear that each encapsulation block 25 can cover a group of light-emitting diodes, for example from 2 to 100 light-emitting diodes. The encapsulation block can cover each light-emitting diode of the group along the entire lateral wall 18 of the light-emitting diode.

Finally, the practical implementation of the embodiments and variants described herein is within the capabilities of those skilled in the art based on the functional description provided hereinabove.

The invention claimed is:

1. An optoelectronic device comprising:
   a support comprising a face;
   light-emitting diodes lying on the face and comprising semiconductor elements in the form of wires, cones, or truncated cones;
   for each light-emitting diode or each group of light-emitting diodes, an encapsulation block at least partially transparent to the radiation emitted by the light-emitting diodes and covering the light-emitting diode along the entire lateral wall of the light-emitting diode or the group of light-emitting diodes along the entire lateral wall of each light-emitting diode, the maximum thickness of the encapsulation block being comprised between 1 µm and 30 µm, interstices of air being present between the encapsulation blocks covering adjacent light-emitting diodes or adjacent groups of light-emitting diodes; and
   an electrically conductive layer covering the encapsulation blocks and in contact with each light-emitting diode;
   wherein the refractive index of the encapsulation block covering at least one of the light-emitting diodes or one of the groups of light-emitting diodes is comprised between 1.3 and 1.6.

2. The optoelectronic device according to claim 1, wherein, for each light-emitting diode or each group of light-emitting diodes, the encapsulation block covers the light-emitting diode or each light-emitting diode of the group along the entire lateral wall of the light-emitting diode.

3. The optoelectronic device according to claim 1, wherein each semiconductor element is a III-V compound.

4. The optoelectronic device according to claim 3, wherein each semiconductor element comprises gallium nitride.

5. The optoelectronic device according to claim 1, wherein the average diameter of each semiconductor element is comprised between 200 nm and 2 µm and wherein the average diameter of each encapsulation block is comprised between 3 µm and 30 µm.

6. The optoelectronic device according to claim 1, comprising, moreover, for at least one light-emitting diode, a photoluminescent layer covering the encapsulation block.

7. The optoelectronic device according to claim 1, comprising lenses covering the encapsulation blocks, the interstices of air being present between the lenses.

8. The optoelectronic device according to claim 7, comprising, moreover, an angular filter covering the lenses.

9. The optoelectronic device according to claim 8, wherein the angular filter comprises a layer at least partially opaque to the visible light and comprising openings.

10. An optoelectronic device comprising:
    a support comprising a face;
    light-emitting diodes lying on the face and comprising semiconductor elements in the form of wires, cones, or truncated cones;
    for each light-emitting diode or each group of light-emitting diodes, an encapsulation block at least partially transparent to the radiation emitted by the light-emitting diodes and covering the light-emitting diode or the group of light-emitting diodes, the maximum thickness of the encapsulation block being comprised between 1 μm and 30 μm, interstices of air being present between the encapsulation blocks covering adjacent diodes or adjacent groups of light-emitting diodes; and an electrically conductive layer covering the encapsulation blocks and in contact with each light-emitting diode, wherein the optoelectronic device comprises, for at least one of the encapsulation blocks, a conformal dielectric layer covering the encapsulation block, at least partially transparent to the radiation emitted by the light-emitting diodes, the refractive index of the encapsulation block being comprised between 1.8 and 2.2, the thickness of the dielectric layer being comprised between 200 nm and 5 μm, and the refractive index of the dielectric layer being comprised between 1.3 and 1.6.

11. The optoelectronic device according to claim 10, wherein the dielectric layer is placed between the electrically conductive layer and the encapsulation block or wherein the electrically conductive layer is placed between the dielectric layer and the encapsulation block.

12. A method for manufacturing an optoelectronic device comprising a support comprising a face and light-emitting diodes lying on the face and comprising semiconductor elements in the form of wires, cones, or truncated cones, the method comprising the formation, for each light-emitting diode or each group of light-emitting diodes, an encapsulation block at least partially transparent to the radiation emitted by the light-emitting diodes and covering the light-emitting diode along the entire lateral wall of the light-emitting diode or the group of light-emitting diodes along the entire lateral wall of each light-emitting diode, the maximum thickness of the encapsulation block being comprised between 1 μm and 30 μm, interstices of air being present between the encapsulation blocks covering adjacent light-emitting diodes or adjacent groups of light-emitting diodes; and the formation of an electrically conductive layer covering the encapsulation blocks and in contact with each light-emitting diode;

wherein the refractive index of the encapsulation block covering at least one of the light-emitting diodes or one of the groups of light-emitting diodes is comprised between 1.3 and 1.6.

13. The method according to claim 12, wherein, for each light-emitting diode or each group of light-emitting diodes, the encapsulation block covers the light-emitting diode or each light-emitting diode of the group along the entire lateral wall of the light-emitting diode.

14. The method according to claim 12, comprising the formation of lenses covering the encapsulation blocks.

15. The method according to claim 14, comprising the formation of a monobloc structure comprising the lenses, each lens comprising a slot and comprising the fixation of the monobloc structure to the support, the encapsulation blocks being inserted in the slots.

16. A method for manufacturing an optoelectronic device comprising a support comprising a face and light-emitting diodes lying on the face and comprising semiconductor elements in the form of wires, cones, or truncated cones, the method comprising the formation, for each light-emitting diode or each group of light-emitting diodes, of an encapsulation block at least partially transparent to the radiation emitted by the light-emitting diodes and covering the light-emitting diode or the group of light-emitting diodes, the maximum thickness of the encapsulation block being comprised between 1 μm and 30 μm, interstices of air being present between the encapsulation blocks covering adjacent light-emitting diodes or adjacent groups of light-emitting diodes, and the formation of an electrically conductive layer covering the encapsulation blocks and in contact with each light-emitting diode, wherein the optoelectronic device comprises, for at least one of the encapsulation blocks, a conformal dielectric layer covering the encapsulation block and at least partially transparent to the radiation emitted by the light-emitting diodes, the refractive index of the encapsulation block being comprised between 1.8 and 2.2, the thickness of the dielectric layer being comprised between 200 nm and 5 μm, and the refractive index of the dielectric layer being comprised between 1.3 and 1.6.

* * * * *